(12) United States Patent
Querbach et al.

(10) Patent No.: US 11,264,094 B2
(45) Date of Patent: Mar. 1, 2022

(54) MEMORY CELL INCLUDING MULTI-LEVEL SENSING

(71) Applicant: Intel Corporation, Santa Clara, CA (US)

(72) Inventors: Bruce Querbach, Hillsboro, OR (US); Christopher Connor, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/911,350

(22) Filed: Mar. 5, 2018

(65) Prior Publication Data

US 2019/0043570 A1 Feb. 7, 2019

(51) Int. Cl.
| | |
|---|---|
| *G11C 11/56* | (2006.01) |
| *G11C 13/00* | (2006.01) |
| *G11C 11/408* | (2006.01) |
| *H03K 19/0175* | (2006.01) |
| *G11C 14/00* | (2006.01) |
| *G11C 29/12* | (2006.01) |
| *G11C 7/16* | (2006.01) |
| *G11C 7/06* | (2006.01) |
| *G11C 27/00* | (2006.01) |
| G11C 29/02 | (2006.01) |
| G11C 29/04 | (2006.01) |

(52) U.S. Cl.
CPC ............ *G11C 13/004* (2013.01); *G11C 7/06* (2013.01); *G11C 7/16* (2013.01); *G11C 11/4082* (2013.01); *G11C 11/56* (2013.01); *G11C 11/5642* (2013.01); *G11C 11/5678* (2013.01); *G11C 11/5685* (2013.01); *G11C 13/0004* (2013.01); *G11C 14/0045* (2013.01); *G11C 27/005* (2013.01); *G11C 29/12* (2013.01); *H03K 19/0175* (2013.01); *G11C 29/021* (2013.01); *G11C 29/028* (2013.01); *G11C 2013/0042* (2013.01); *G11C 2029/0409* (2013.01); *G11C 2029/0411* (2013.01); *G11C 2029/1204* (2013.01); *G11C 2213/71* (2013.01)

(58) Field of Classification Search
CPC .............................................. G11C 2211/5641
USPC .................................................... 711/E12.001
See application file for complete search history.

(56) References Cited

U.S. PATENT DOCUMENTS

| | | | |
|---|---|---|---|
| 8,174,875 B2 * | 5/2012 | Baek | G11C 11/1675 365/148 |
| 9,691,492 B1 | 6/2017 | Querbach et al. | |
| 2007/0262890 A1 | 11/2007 | Cornwell et al. | |
| | | (Continued) | |

OTHER PUBLICATIONS

Extended European Search Report for European Patent Application No. 19/153851.1, dated Jul. 22, 2019, 11 pages.

*Primary Examiner* — Min Huang
(74) *Attorney, Agent, or Firm* — Jordan IP Law, LLC

(57) ABSTRACT

An embodiment of a semiconductor apparatus may include technology to convert an analog voltage level of a memory cell of a multi-level memory to a multi-bit digital value, and determine a single-bit value of the memory cell based on the multi-bit digital value. Some embodiments may also include technology to track a temporal history of accesses to the memory cell for a duration in excess of ten seconds, and determine the single-bit value of the memory cell based on the multi-bit digital value and the temporal history. Other embodiments are disclosed and claimed.

19 Claims, 7 Drawing Sheets

(56) References Cited

U.S. PATENT DOCUMENTS

| | | |
|---|---|---|
| 2008/0310244 A1 | 12/2008 | Baker |
| 2011/0060861 A1* | 3/2011 | Warren ............... G06F 12/0246 |
| | | 711/103 |
| 2011/0185111 A1* | 7/2011 | Warren ............... G11C 11/5628 |
| | | 711/103 |
| 2013/0051141 A1 | 2/2013 | Moshchiano et al. |
| 2014/0056068 A1 | 2/2014 | Strasser et al. |
| 2015/0277768 A1* | 10/2015 | Zhou ....................... G06F 3/061 |
| | | 711/114 |
| 2017/0206979 A1 | 7/2017 | Cohen et al. |
| 2018/0011753 A1 | 1/2018 | Alhussien et al. |
| 2018/0012663 A1 | 1/2018 | Alhussien et al. |

\* cited by examiner

MEMORY CELL INCLUDING MULTI-LEVEL SENSING

TECHNICAL FIELD

Embodiments generally relate to memory systems. More particularly, embodiments relate to a memory cell including multi-level sensing.

BACKGROUND

A multi-level non-volatile memory stores more than one bit per cell. Multi-level NAND memory having four (4) possible voltage levels per cell, may represent two (2) bits of data per cell. NAND memory having eight (8) voltage levels per cell may be referred to as triple-level cell (TLC) memory and may represent three (3) bits of data per cell. NAND memory having sixteen (16) voltage levels per cell may be referred to as quad-level cell (QLC) memory and may represent four (4) bits of data per cell.

BRIEF DESCRIPTION OF THE DRAWINGS

The various advantages of the embodiments will become apparent to one skilled in the art by reading the following specification and appended claims, and by referencing the following drawings, in which:

DESCRIPTION OF EMBODIMENTS

Various embodiments described herein may include a memory component and/or an interface to a memory component. Such memory components may include volatile and/or nonvolatile memory. Nonvolatile memory may be a storage medium that does not require power to maintain the state of data stored by the medium. In one embodiment, the memory device may include a block addressable memory device, such as those based on NAND or NOR technologies. A memory device may also include future generation non-volatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device, or a combination of any of the above, or other memory. The memory device may refer to the die itself and/or to a packaged memory product. In particular embodiments, a memory component with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at jedec.org).

Volatile memory may be a storage medium that requires power to maintain the state of data stored by the medium. Non-limiting examples of volatile memory may include various types of RAM, such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at www.jedec.org). Such standards (and similar standards) may be referred to as DDR-based standards and communication interfaces of the storage devices that implement such standards may be referred to as DDR-based interfaces.

Figure 1:
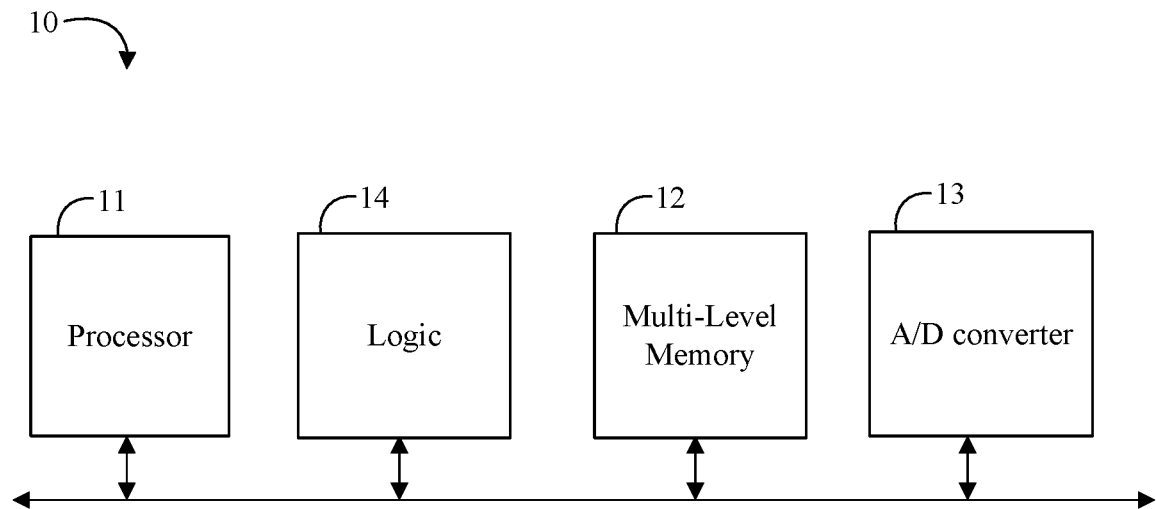
FIG. 1 is a block diagram of an example of an electronic processing system according to an embodiment.

Turning now to FIG. 1, an embodiment of an electronic processing system 10 may include a processor 11, multi-level memory 12 communicatively coupled to the processor 11, an analog-to-digital converter (ADC) 13 communicatively coupled to the multi-level memory 12 to convert an analog voltage level of a memory cell of the multi-level memory 12 to a corresponding multi-bit digital value, and logic 14 communicatively coupled to the multi-level memory 12 and the ADC 13 to determine a single-bit value of the memory cell based on the multi-bit digital value. In some embodiments, the logic 14 may be further configured to apply error correction to determine the value of the memory cell based on the multi-bit digital value. In some embodiments, the logic 14 may also be configured to track a history of accesses to the memory cell. For example, the logic 14 may be configured to track a temporal history of accesses to the memory cell for a duration in excess of ten seconds, and may also be configured to determine the single-bit value of the memory cell based on the multi-bit digital value and the temporal history of accesses to the memory cell (e.g., to adjust for potential drift of the analog voltage level of the memory cell). In some embodiments, the multi-level memory may include a PCM. For example, the PCM may include a 3D crosspoint memory (e.g., such as INTEL 3D XPOINT memory). In some embodiments, the ADC 13 and/or the logic 14 may be located in, or co-located with, various components, including the processor 11 and/or multi-level memory 12 (e.g., on a same die).

Embodiments of each of the above processor 11, multi-level memory 12, ADC 13, logic 14, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof.

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C# or the like and conventional procedural programming languages, such as the "C" programming language or similar programming languages. For example, the multi-level memory 12, persistent storage media, or other system memory may store a set of instructions which when executed by the processor 11 cause the system 10 to implement one or more components, features, or aspects of the system 10 (e.g., the logic 14, determining the single-bit value of the memory cell based on the multi-bit digital value, applying error correction to determine the value of the memory cell based on the multi-bit digital value, tracking a history of accesses to the memory cell, etc.).

Figure 2:
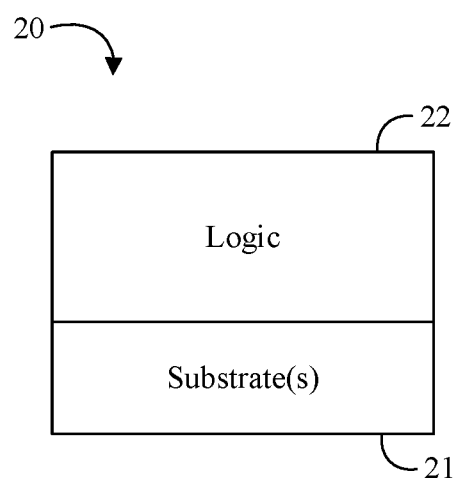
FIG. 2 is a block diagram of an example of a semiconductor apparatus according to an embodiment.

Turning now to FIG. 2, an embodiment of a semiconductor apparatus 20 may include one or more substrates 21, and logic 22 coupled to the one or more substrates 21, wherein the logic 22 is at least partly implemented in one or more of configurable logic and fixed-functionality hardware logic. The logic 22 coupled to the one or more substrates 21 may be configured to convert an analog voltage level of a memory cell of a multi-level memory to a multi-bit digital value, and determine a single-bit value of the memory cell based on the multi-bit digital value. In some embodiments, the logic 22 may be further configured to apply error correction to determine the value of the memory cell based on the multi-bit digital value. In some embodiments, the logic 22 may also be configured to track a history of accesses to the memory cell. For example, the logic 22 may be configured to track a temporal history of accesses to the memory cell for a duration in excess of ten seconds, and may also be configured to determine the single-bit value of the memory cell based on the multi-bit digital value and the temporal history of accesses to the memory cell (e.g., to adjust for potential drift of the analog voltage level of the memory cell). In some embodiments, the multi-level memory may include a PCM such as, for example, a 3D crosspoint memory. In some embodiments, the logic 22 coupled to the one or more substrates 21 may include transistor channel regions that are positioned within the one or more substrates 21.

Embodiments of logic 22, and other components of the apparatus 20, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 20 may implement one or more aspects of the method 30 (FIGS. 3A to 3C), or any of the embodiments discussed herein. In some embodiments, the illustrated apparatus 20 may include the one or more substrates 21 (e.g., silicon, sapphire, gallium arsenide) and the logic 22 (e.g., transistor array and other integrated circuit/IC components) coupled to the substrate(s) 21. The logic 22 may be implemented at least partly in configurable logic or fixed-functionality logic hardware. In one example, the logic 22 may include transistor channel regions that are positioned (e.g., embedded) within the substrate(s) 21. Thus, the interface between the logic 22 and the substrate(s) 21 may not be an abrupt junction. The logic 22 may also be considered to include an epitaxial layer that is grown on an initial wafer of the substrate(s) 21.

Figure 3A:
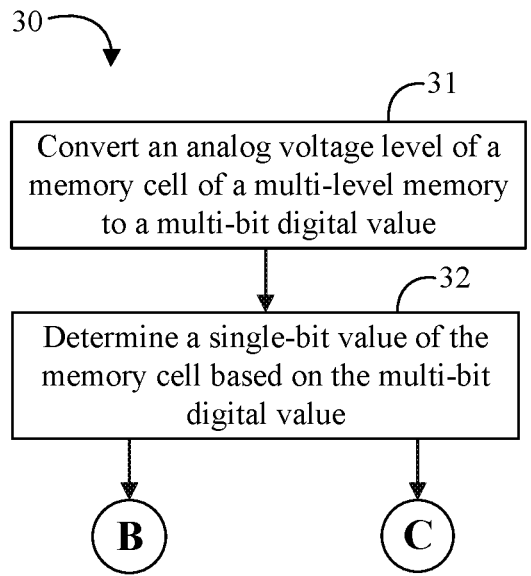
FIGS. 3A to 3C are flowcharts of an example of a method of determining a memory value according to an embodiment.
Figure 3B:
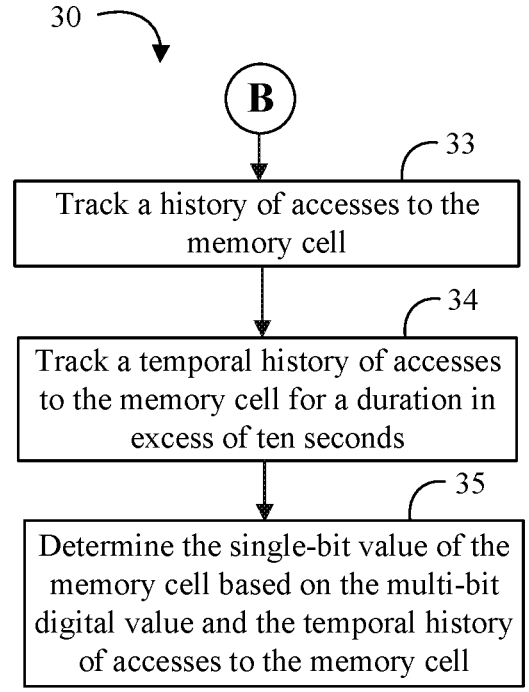
Figure 3C:
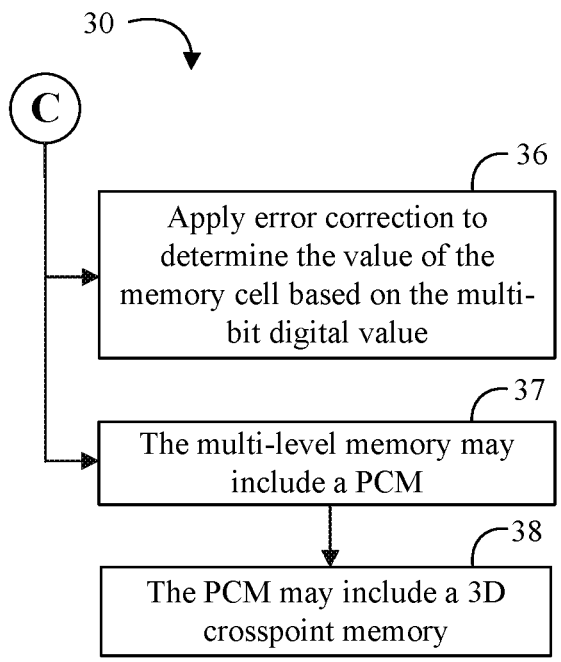

Turning now to FIGS. 3A to 3C, an embodiment of a method 30 of determining a memory value may include converting an analog voltage level of a memory cell of a multi-level memory to a multi-bit digital value at block 31, and determining a single-bit value of the memory cell based on the multi-bit digital value at block 32. Some embodiments of the method 30 may further include tracking a history of accesses to the memory cell at block 33. For example, the method 30 may also include tracking a temporal history of accesses to the memory cell for a duration in excess of ten seconds at block 34, and determining the single-bit value of the memory cell based on the multi-bit digital value and the temporal history of accesses to the memory cell at block 35 (e.g., adjusting for potential drift of the analog voltage level of the memory cell). Some embodiments of the method 30 may further include applying error correction to determine the value of the memory cell based on the multi-bit digital value at block 36. For example, the multi-level memory may include a PCM at block 37. For example, the PCM may include a 3D crosspoint memory at block 38.

Embodiments of the method 30 may be implemented in a system, apparatus, computer, device, etc., for example, such as those described herein. More particularly, hardware implementations of the method 30 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 30 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 30 may be implemented on a computer readable medium as described in connection with Examples 23 to 29 below. Embodiments or portions of the method 30 may be implemented in firmware, applications (e.g., through an application programming interface (API)), or driver software running on an operating system (OS).

Figure 4:
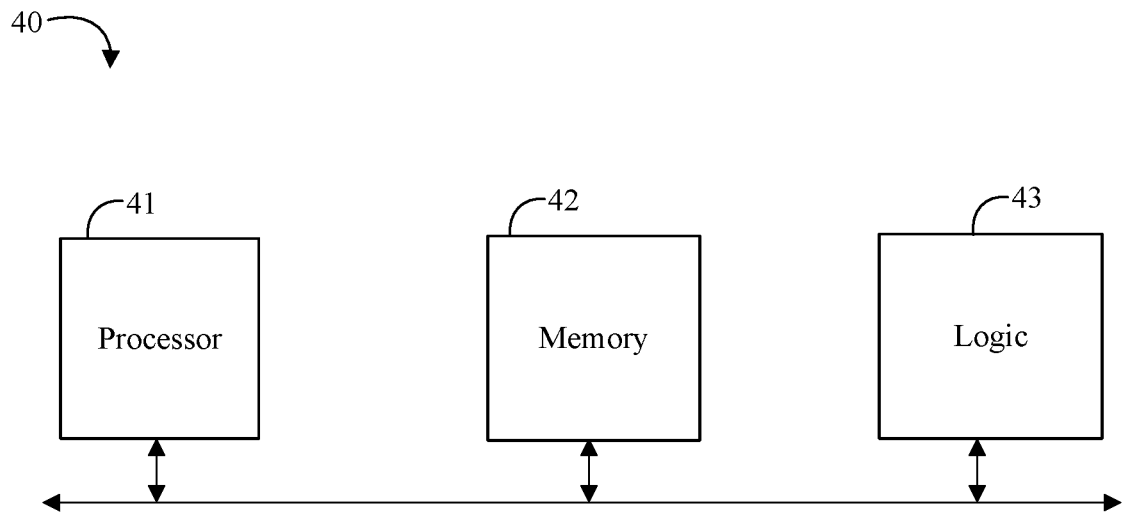
FIG. 4 is a block diagram of another example of an electronic processing system according to an embodiment.

Turning now to FIG. 4, an embodiment of an electronic processing system 40 may include a processor 41, memory 42 communicatively coupled to the processor 41, and logic 43 communicatively coupled to the memory 42 to track a history of accesses to a memory cell of the memory 42, and determine a value of the memory cell based at least in part on the history of accesses to the memory cell. In some embodiments, the logic 43 may be configured to track a temporal history of accesses to the memory cell for a duration in excess of ten seconds. For example, the logic 43 may be further configured to determine a digital value corresponding to a sensed voltage of the memory cell (e.g., provided from an ADC), and determine the value of the memory cell based on the digital value and the temporal history of accesses to the memory cell (e.g., to adjust for potential drift of an analog voltage level of the memory cell). Some embodiments of the logic 43 may be further configured to apply error correction to determine the value of the memory cell (e.g., based on the digital value). In some embodiments, the memory 42 may include multi-level memory such as PCM (e.g., including 3D crosspoint memory).

Embodiments of the processor 41, the memory 42, the logic 43, and other components of the system 40, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

Figure 5:
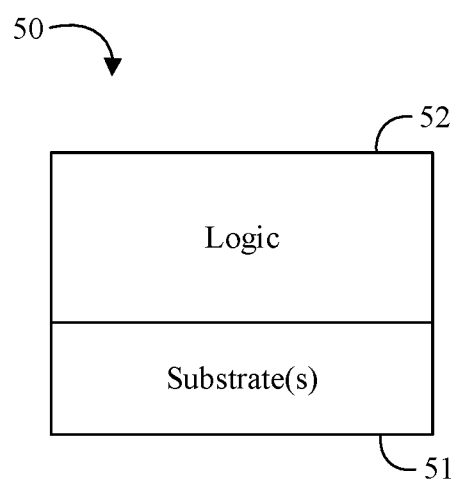
FIG. 5 is a block diagram of another example of a semiconductor apparatus according to an embodiment.

Turning now to FIG. 5, an embodiment of a semiconductor apparatus 50 may include one or more substrates 51, and logic 52 coupled to the one or more substrates 51, wherein the logic 52 is at least partly implemented in one or more of configurable logic and fixed-functionality hardware logic. The logic 52 coupled to the one or more substrates 51 may be configured to track a history of accesses to a memory cell, and determine a value of the memory cell based at least in part on the history of accesses to the memory cell. In some embodiments, the logic 52 may be configured to track a temporal history of accesses to the memory cell for a duration in excess of ten seconds. For example, the logic 52 may be further configured to determine a digital value corresponding to a sensed voltage of the memory cell (e.g., provided from an ADC), and determine the value of the memory cell based on the digital value and the temporal history of accesses to the memory cell (e.g., to adjust for potential drift of an analog voltage level of the memory cell). Some embodiments of the logic 52 may be further configured to apply error correction to determine the value of the memory cell (e.g., based on the digital value). In some embodiments, the memory may include multi-level memory such as PCM (e.g., including 3D crosspoint memory). In some embodiments, the logic 52 coupled to the one or more substrates 51 may include transistor channel regions that are positioned within the one or more substrates 51.

Embodiments of logic 52, and other components of the apparatus 50, may be implemented in hardware, software, or any combination thereof including at least a partial implementation in hardware. For example, hardware implementations may include configurable logic such as, for example, PLAs, FPGAs, CPLDs, or fixed-functionality logic hardware using circuit technology such as, for example, ASIC, CMOS, or TTL technology, or any combination thereof. Additionally, portions of these components may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

The apparatus 50 may implement one or more aspects of the method 60 (FIGS. 6A to 6C), or any of the embodiments discussed herein. In some embodiments, the illustrated apparatus 50 may include the one or more substrates 51 (e.g., silicon, sapphire, gallium arsenide) and the logic 52 (e.g., transistor array and other integrated circuit/IC components) coupled to the substrate(s) 51. The logic 52 may be implemented at least partly in configurable logic or fixed-functionality logic hardware. In one example, the logic 52 may include transistor channel regions that are positioned (e.g., embedded) within the substrate(s) 51. Thus, the interface between the logic 52 and the substrate(s) 51 may not be an abrupt junction. The logic 52 may also be considered to include an epitaxial layer that is grown on an initial wafer of the substrate(s) 51.

Figure 6A:
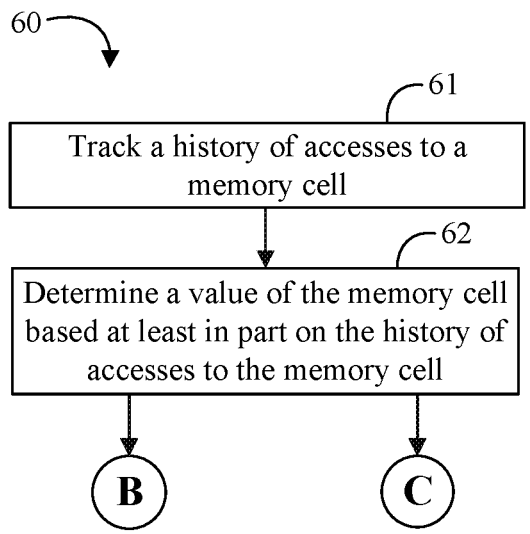
FIGS. 6A to 6C are flowcharts of another example of a method of determining a memory value according to an embodiment.
Figure 6B:
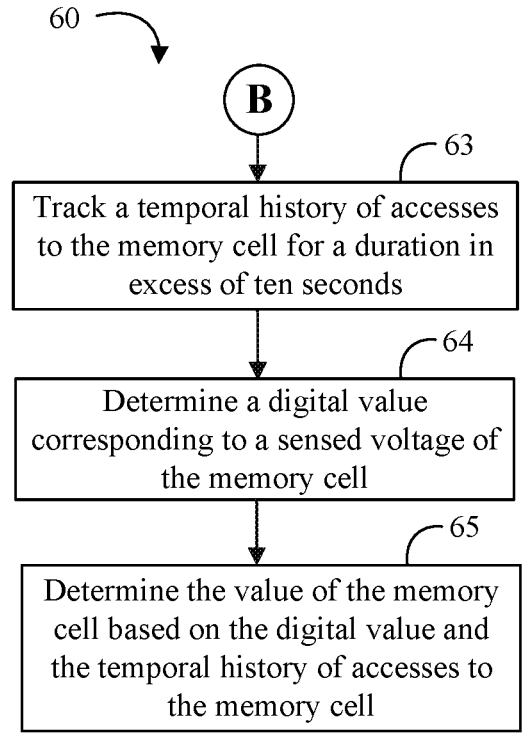
Figure 6C:
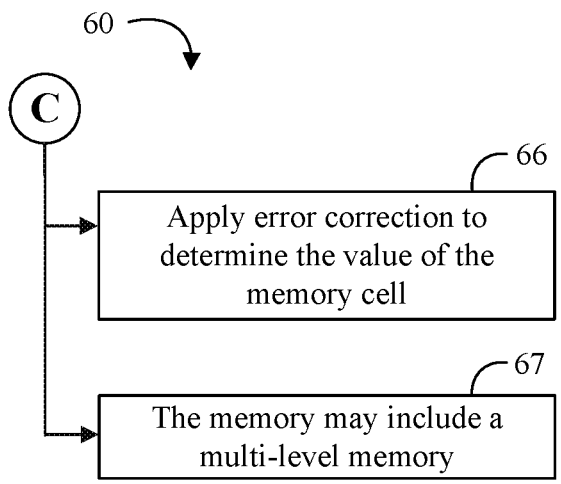

Turning now to FIGS. 6A to 6C, an embodiment of a method 60 of determining a memory value may include tracking a history of accesses to a memory cell at block 61, and determining a value of the memory cell based at least in part on the history of accesses to the memory cell at block 62. Some embodiments of the method 60 may include tracking a temporal history of accesses to the memory cell for a duration in excess of ten seconds at block 63. For example, the method 60 may include determining a digital value corresponding to a sensed voltage of the memory cell at block 64, and determining the value of the memory cell based on the digital value and the temporal history of accesses to the memory cell at block 65 (e.g., adjusting for potential drift of an analog voltage level of the memory cell).

Some embodiments of the method 60 may further include applying error correction to determine the value of the memory cell at block 66 (e.g., based on the digital value). For example, the memory may include a multi-level memory at block 67 (e.g., a PCM such as a 3D crosspoint memory).

Embodiments of the method 60 may be implemented in a system, apparatus, computer, device, etc., for example, such as those described herein. More particularly, hardware implementations of the method 60 may include configurable logic such as, for example, PLAs, FPGAs, CPLDs, or in fixed-functionality logic hardware using circuit technology such as, for example, ASIC, CMOS, or TTL technology, or any combination thereof. Alternatively, or additionally, the method 60 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C# or the like and conventional procedural programming languages, such as the "C" programming language or similar programming languages.

For example, the method 60 may be implemented on a computer readable medium as described in connection with Examples 52 to 56 below. Embodiments or portions of the method 60 may be implemented in firmware, applications (e.g., through an application programming interface (API)), or driver software running on an operating system (OS).

Some embodiments may advantageously provide a multi-level sensing 3D crosspoint cell technology for fast, low latency, and/or high performance non volatile memory (NVM). Some PCM (e.g., including some 3D crosspoint memory) may be nonvolatile as memory, but the demarcation voltage ($V_{DM}$) (e.g., for read) to determine if a cell's content is a one (1) or a zero (0) may drift over time. The voltage drift may lead to high bit rate error (BER) if a single static $V_{DM}$ is used to read the value of the memory cell. Some other systems may track time since a last read/write for a cell, and dynamic $V_{DM}$ technology may be used to track the drift (e.g., retrying a read with different levels of $V_{DM}$). For example, the $V_{DM}$ for a PCM may drift over a time period of seconds, minutes, hours, or even days. The $V_{DM}$ drift may result in a corresponding BER increase. If a given $V_{DM}$ does not work (e.g., BER is too high), some systems may retry the read with a different $V_{DM}$ (e.g., a $V_{DM}$ retry). However, $V_{DM}$ retry may remain as a problem in some systems because not all events that affect $V_{DM}$ drift may be tracked precisely.

In some systems, $V_{DM}$ retry may be acceptable to ensure correctness of data retention. In high performance memory usage, however, a $V_{DM}$ retry may cause significant latency and/or performance degradation. For example, some other systems may utilize a high $V_{DM}$ if the cell is known to be recently accessed. If the BER from such read attempts is unacceptably high, the read may be retried using a lower $V_{DM}$. Such latency caused by $V_{DM}$ retry may have a significant impact on memory applications performance measurement. Advantageously, some embodiments may ensure correct data retention and also reduce or eliminate $V_{DM}$ retries using multi-level sense cell level technology to provide a faster and higher performance memory cell.

Figure 7:
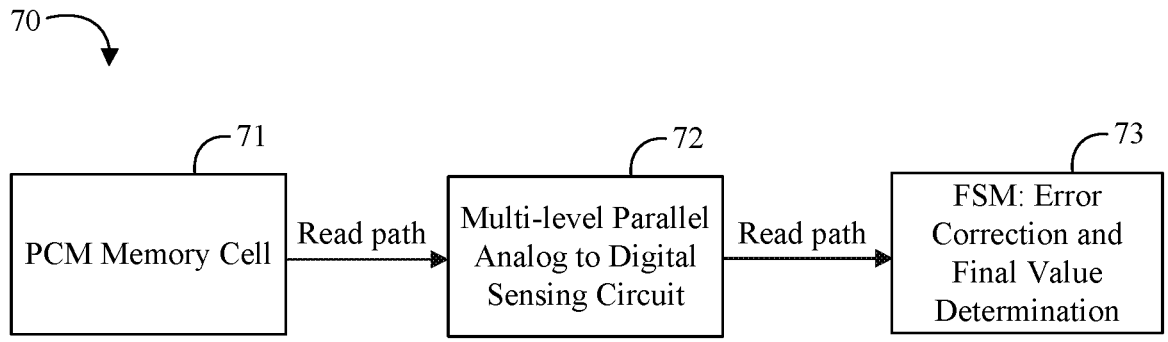
FIG. 7 is a block diagram of an example of memory apparatus according to an embodiment.

Turning now to FIG. 7, an example of a memory apparatus 70 may include a PCM memory cell 71 communicatively coupled along a read path to a multi-level parallel analog-to-digital (A/D) sensing circuit 72 (e.g., 4 level, 16 level, etc.). An output of the A/D circuit 72 may be communicatively coupled along the read path to a finite state machine (FSM) 73 to apply error correction and make the final value determination for the PCM memory cell 71. Advantageously, some embodiments may include cell level technology which provides high performance memory cells by placing multi-level sensing circuits in the read path (e.g., ADC circuits). Instead of assuming that a single voltage that separates a memory cell value of 1 and 0, or retrying multiple times with several voltage levels to read the memory cell value, some embodiments may sense once to determine what voltage level the memory cell contains, and post process the sensed value to determine if the memory cell value corresponds to a 1 or 0. Advantageously, some embodiments may essentially guarantee that each cell may be read a single time to determine the value of each cell, thereby eliminating $V_{DM}$ retries and the associated latency.

Some embodiments may modify a PCM memory cell by adding a four (4) level parallel ADC in the read path, followed by a FSM for the final value determination and error correction. Advantageously, no matter what level the voltage is held in the cell and regardless of how long the cell has drifted due to inactivity, some embodiments may read the memory cell just one time through the 4 level ADC and there may be no retries. The output of the ADC may be fed into a final value determination and error correction FSM to digitally correct any error at a row, column, and/or cache line level that may track the history of when the cells were last written. Advantageously, some embodiments may provide a single point of digital error correction, and further reduce the latency on the read path.

Higher performance (e.g., low latency) NVM may provide system wide impact to DIMM utilization, platform design, CPU architecture, and conventional understanding of some compute models (e.g., the separation between CPU, memory, and storage). Some embodiments of a low latency nonvolatile memory may replace DRAM with NVM and may have the potential to completely change some compute models.

Figure 8:
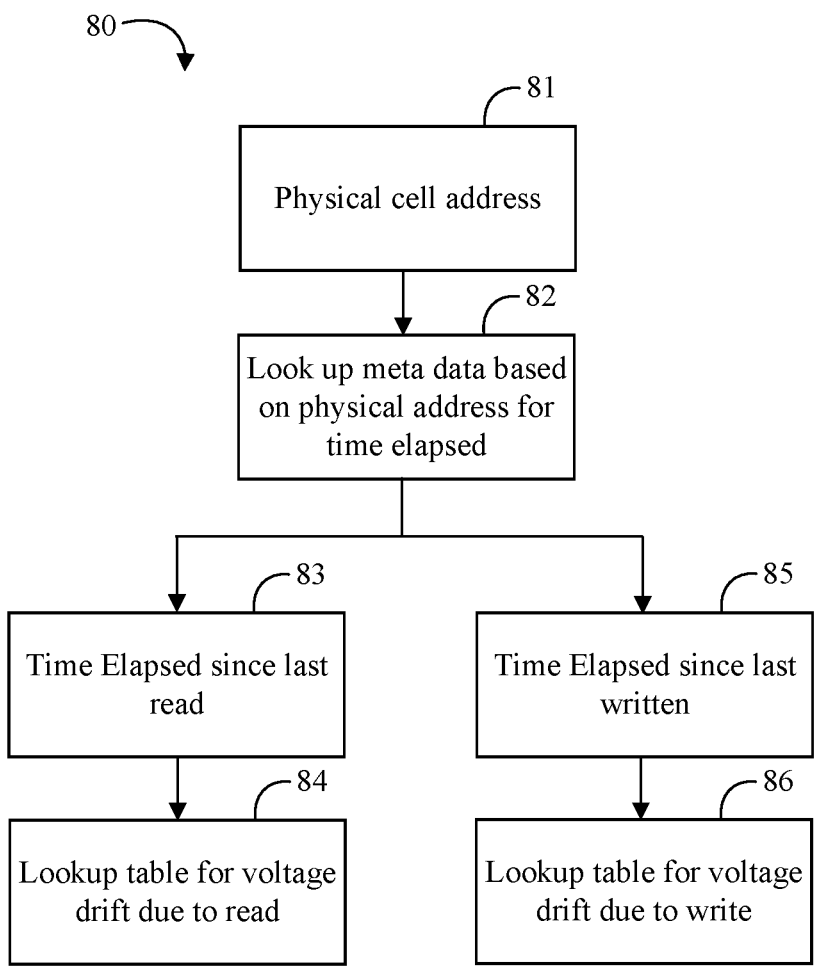
FIG. 8 is a flowchart of an example of a method of determining voltage drift information according to an embodiment.

Turning now to FIG. 8, an embodiment of a method 80 of determining voltage drift information may include starting with a physical cell address at block 81, and looking up meta data based on the physical address for time elapsed at block 82. The method 80 may then include determining time elapsed since a last read at block 83, and utilizing a lookup table to determine voltage drift due to read at block 84. The method 80 may also include determining time elapsed since a last write at block 85, and utilizing a lookup table to determine voltage drift due to write at block 86.

Figure 9:
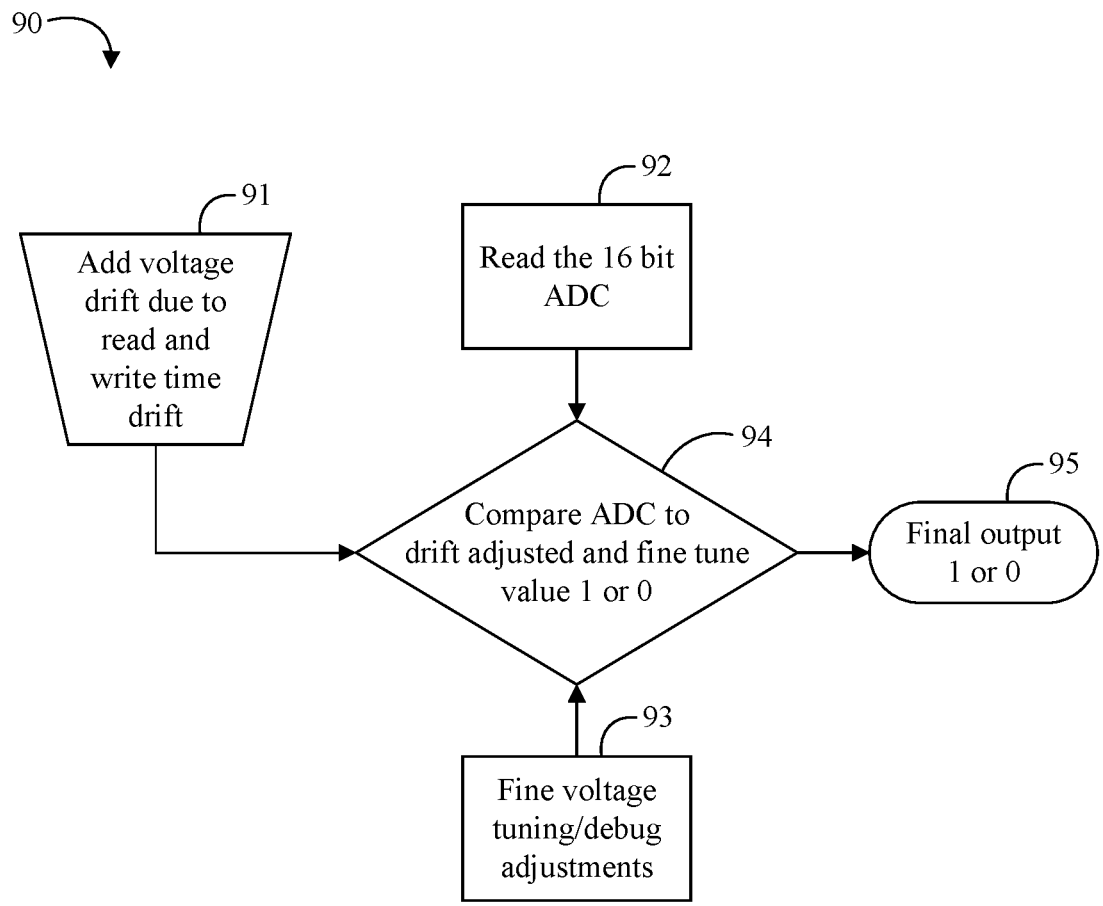
FIG. 9 is a flowchart of an example of a method of determining a final output value according to an embodiment.

Turning now to FIG. 9, an embodiment of a method 90 of determining a final output value may include adding voltage drift due to read and write time drift at block 91 (e.g., as determined by the method 80 from FIG. 8), reading a 16-bit ADC value at block 92 (e.g., corresponding to the analog voltage level of the memory cell), and determining any fine voltage tuning/debug adjustments at block 93. The method 90 may then compare the ADC value to the drift adjusted information, and fine tune the value to a one (1) or a zero (0) at block 94, and provide the final output at a value of one or zero at block 95.

Figure 10:
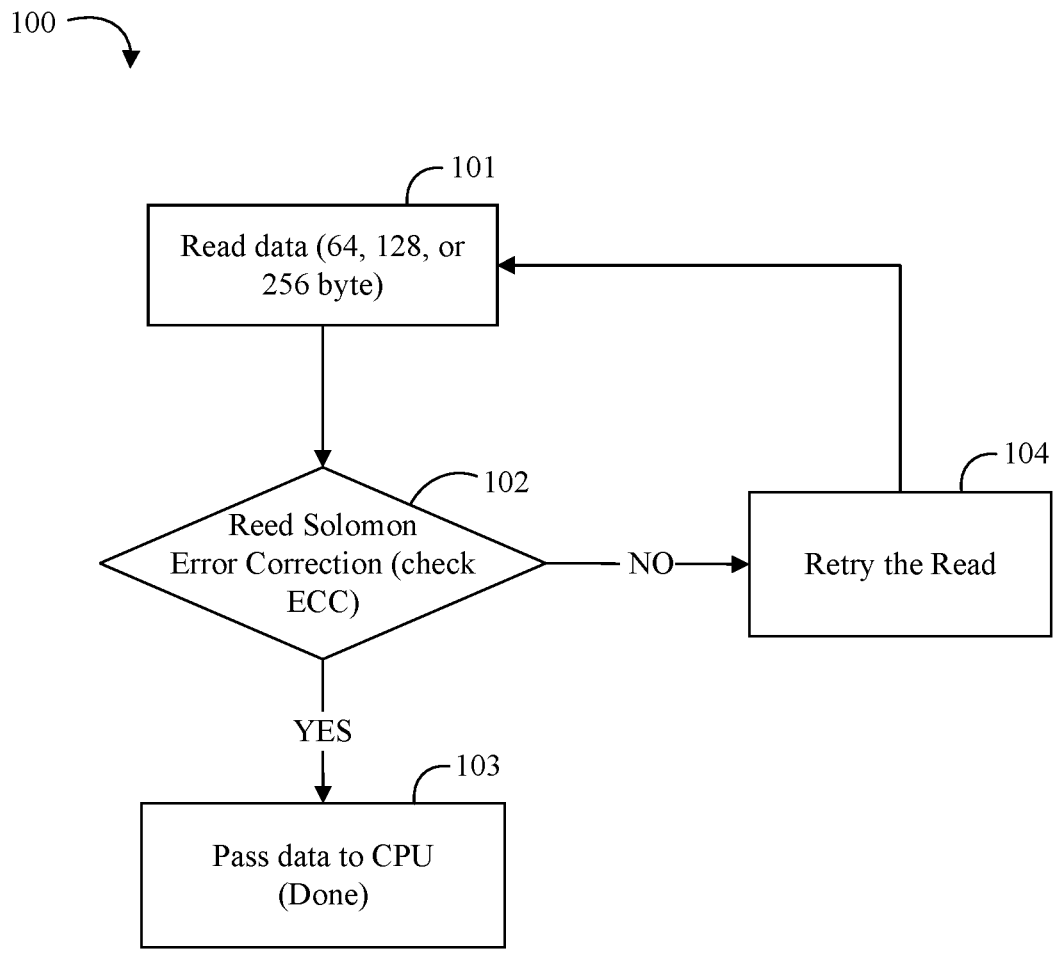
FIG. 10 is a flowchart of an example of a method of reading a memory according to an embodiment.

Turning now to FIG. 10, an embodiment of a method 100 of reading a memory may include reading data at block 101 (e.g., 64, 128, or 256 byte), and checking the ECC at block 102 (e.g., utilizing Reed Solomon error correction). If the ECC passes at block 102, the method 100 may then pass the data the CPU at block 103. Otherwise, the method 100 may retry the read at block 104, returning to block 101.

In some embodiments of PCM multi-level sensing, the history may be relatively long (e.g., measured in tens of seconds, minutes, hours, and days). Some embodiments may store a long history for effective post-processing. In some embodiments utilizing 3D crosspoint memory, for example, the sensing voltage level may be different even after 50 seconds. Accordingly, tracking the history of reads and writes to the cell may be based on a tradeoff between elapsed time versus meta data size and the speed of the history tracker. For example, tracking history down to a few seconds of granularity may require more meta data size and a faster tracker (e.g., more overhead), versus tracking on a minute, hour, day, or week basis granularity (e.g., which may require progressively less overhead).

Advantageously, by utilizing ADC (e.g., 4 or 16 level) sensing technology, some embodiments may effectively remove retries and improve latency. Combining the multi-level sensing with a final value determination and error correction FSM (e.g., at the system level), some embodiments may achieve latency on par with DRAM (e.g., with error correction). Because some embodiments of PCM (e.g., 3D crosspoint memory) may provide lower cost per bit of memory, some embodiments may completely displace DRAM in a system, and may change the compute model by creating a much tighter integration of CPU, memory and storage. For example, some embodiments may provide a compute model which includes only CPU and memory (e.g., where memory is fast, nonvolatile, and large).

Additional Notes and Examples:

Example 1 may include an electronic processing system, comprising a processor, multi-level memory communicatively coupled to the processor, an analog-to-digital converter communicatively coupled to the multi-level memory to convert an analog voltage level of a memory cell of the multi-level memory to a corresponding multi-bit digital value, and logic communicatively coupled to the multi-level memory and the analog-to-digital converter to determine a single-bit value of the memory cell based on the multi-bit digital value.

Example 2 may include the system of Example 1, wherein the logic is further to apply error correction to determine the value of the memory cell based on the multi-bit digital value.

Example 3 may include the system of Example 1, wherein the logic is further to track a history of accesses to the memory cell.

Example 4 may include the system of Example 3, wherein the logic is further to track a temporal history of accesses to the memory cell for a duration in excess of ten seconds.

Example 5 may include the system of Example 4, wherein the logic is further to determine the single-bit value of the memory cell based on the multi-bit digital value and the temporal history of accesses to the memory cell.

Example 6 may include the system of any of Examples 1 to 5, wherein the multi-level memory comprises a phase change memory.

Example 7 may include the system of Example 6, wherein the phase change memory comprises a three dimensional crosspoint memory.

Example 8 may include a semiconductor apparatus, comprising one or more substrates, and logic coupled to the one or more substrates, wherein the logic is at least partly implemented in one or more of configurable logic and fixed-functionality hardware logic, the logic coupled to the one or more substrates to convert an analog voltage level of a memory cell of a multi-level memory to a multi-bit digital value, and determine a single-bit value of the memory cell based on the multi-bit digital value.

Example 9 may include the apparatus of Example 8, wherein the logic is further to apply error correction to determine the value of the memory cell based on the multi-bit digital value.

Example 10 may include the apparatus of Example 8, wherein the logic is further to track a history of accesses to the memory cell.

Example 11 may include the apparatus of Example 10, wherein the logic is further to track a temporal history of accesses to the memory cell for a duration in excess of ten seconds.

Example 12 may include the apparatus of Example 11, wherein the logic is further to determine the single-bit value of the memory cell based on the multi-bit digital value and the temporal history of accesses to the memory cell.

Example 13 may include the apparatus of any of Examples 8 to 12, wherein the multi-level memory comprises a phase change memory.

Example 14 may include the apparatus of Example 13, wherein the phase change memory comprises a three dimensional crosspoint memory.

Example 15 may include the apparatus of any of Examples 8 to 14, wherein the logic coupled to the one or more substrates includes transistor channel regions that are positioned within the one or more substrates.

Example 16 may include a method of determining a memory value, comprising converting an analog voltage level of a memory cell of a multi-level memory to a multi-bit digital value, and determining a single-bit value of the memory cell based on the multi-bit digital value.

Example 17 may include the method of Example 16, further comprising applying error correction to determine the value of the memory cell based on the multi-bit digital value.

Example 18 may include the method of Example 16, further comprising tracking a history of accesses to the memory cell.

Example 19 may include the method of Example 18, further comprising tracking a temporal history of accesses to the memory cell for a duration in excess of ten seconds.

Example 20 may include the method of Example 19, further comprising determining the single-bit value of the memory cell based on the multi-bit digital value and the temporal history of accesses to the memory cell.

Example 21 may include the method of any of Examples 16 to 20, wherein the multi-level memory comprises a phase change memory.

Example 22 may include the method of Example 21, wherein the phase change memory comprises a three dimensional crosspoint memory.

Example 23 may include at least one computer readable medium, comprising a set of instructions, which when executed by a computing device, cause the computing device to determine a multi-bit digital value corresponding to a sensed voltage level of a multi-level memory, and determine a single-bit value of the memory cell based on the multi-bit digital value.

Example 24 may include the at least one computer readable medium of Example 23, comprising a further set of instructions, which when executed by the computing device, cause the computing device to apply error correction to determine the value of the memory cell based on the multi-bit digital value.

Example 25 may include the at least one computer readable medium of Example 23, comprising a further set of instructions, which when executed by the computing device, cause the computing device to track a history of accesses to the memory cell.

Example 26 may include the at least one computer readable medium of Example 25, comprising a further set of instructions, which when executed by the computing device, cause the computing device to track a temporal history of accesses to the memory cell for a duration in excess of ten seconds.

Example 27 may include the at least one computer readable medium of Example 26, comprising a further set of instructions, which when executed by the computing device, cause the computing device to determine the single-bit value of the memory cell based on the multi-bit digital value and the temporal history of accesses to the memory cell.

Example 28 may include the at least one computer readable medium of any of Examples 23 to 27, wherein the multi-level memory comprises a phase change memory.

Example 29 may include the at least one computer readable medium of Example 28, wherein the phase change memory comprises a three dimensional crosspoint memory.

Example 30 may include a memory apparatus, comprising means for converting an analog voltage level of a memory cell of a multi-level memory to a multi-bit digital value, and means for determining a single-bit value of the memory cell based on the multi-bit digital value.

Example 31 may include the apparatus of Example 30, further comprising means for applying error correction to determine the value of the memory cell based on the multi-bit digital value.

Example 32 may include the apparatus of Example 30, further comprising means for tracking a history of accesses to the memory cell.

Example 33 may include the apparatus of Example 32, further comprising means for tracking a temporal history of accesses to the memory cell for a duration in excess of ten seconds.

Example 34 may include the apparatus of Example 33, further comprising means for determining the single-bit value of the memory cell based on the multi-bit digital value and the temporal history of accesses to the memory cell.

Example 35 may include the apparatus of any of Examples 30 to 34, wherein the multi-level memory comprises a phase change memory.

Example 36 may include the apparatus of Example 35, wherein the phase change memory comprises a three dimensional crosspoint memory.

Example 37 may include an electronic processing system, comprising a processor, memory communicatively coupled to the processor, and logic communicatively coupled to the memory to track a history of accesses to a memory cell of the memory, and determine a value of the memory cell based at least in part on the history of accesses to the memory cell.

Example 38 may include the system of Example 37, wherein the logic is further to track a temporal history of accesses to the memory cell for a duration in excess of ten seconds.

Example 39 may include the system of Example 38, wherein the logic is further to determine a digital value corresponding to a sensed voltage of the memory cell, and determine the value of the memory cell based on the digital value and the temporal history of accesses to the memory cell.

Example 40 may include the system of any of Examples 37 to 39, wherein the memory comprises a multi-level memory.

Example 41 may include the system of Example 40, wherein the multi-level memory comprises a phase change memory.

Example 42 may include a semiconductor apparatus, comprising one or more substrates, and logic coupled to the one or more substrates, wherein the logic is at least partly implemented in one or more of configurable logic and fixed-functionality hardware logic, the logic coupled to the one or more substrates to track a history of accesses to a memory cell, and determine a value of the memory cell based at least in part on the history of accesses to the memory cell.

Example 43 may include the apparatus of Example 42, wherein the logic is further to track a temporal history of accesses to the memory cell for a duration in excess of ten seconds.

Example 44 may include the apparatus of Example 43, wherein the logic is further to determine a digital value corresponding to a sensed voltage of the memory cell, and determine the value of the memory cell based on the digital value and the temporal history of accesses to the memory cell.

Example 45 may include the apparatus of any of Examples 42 to 44, wherein the memory comprises a multi-level memory.

Example 46 may include the apparatus of Example 45, wherein the multi-level memory comprises a phase change memory.

Example 47 may include a method of determining a memory value, comprising tracking a history of accesses to a memory cell, and determining a value of the memory cell based at least in part on the history of accesses to the memory cell.

Example 48 may include the method of Example 47, further comprising tracking a temporal history of accesses to the memory cell for a duration in excess of ten seconds.

Example 49 may include the method of Example 48, further comprising determining a digital value corresponding to a sensed voltage of the memory cell, and determining the value of the memory cell based on the digital value and the temporal history of accesses to the memory cell.

Example 50 may include the method of any of Examples 47 to 49, wherein the memory comprises a multi-level memory.

Example 51 may include the method of Example 50, wherein the multi-level memory comprises a phase change memory.

Example 52 may include at least one computer readable medium, comprising a set of instructions, which when executed by a computing device, cause the computing device to track a history of accesses to a memory cell, and determine a value of the memory cell based at least in part on the history of accesses to the memory cell.

Example 53 may include the at least one computer readable medium of Example 52, comprising a further set of instructions, which when executed by the computing device, cause the computing device to track a temporal history of accesses to the memory cell for a duration in excess of ten seconds.

Example 54 may include the at least one computer readable medium of Example 53, comprising a further set of instructions, which when executed by the computing device, cause the computing device to determine a digital value corresponding to a sensed voltage of the memory cell, and determine the value of the memory cell based on the digital value and the temporal history of accesses to the memory cell.

Example 55 may include the at least one computer readable medium of any of Examples 52 to 54, wherein the memory comprises a multi-level memory.

Example 56 may include the at least one computer readable medium of Example 55, wherein the multi-level memory comprises a phase change memory.

Example 57 may include a memory apparatus, comprising means for tracking a history of accesses to a memory cell, and means for determining a value of the memory cell based at least in part on the history of accesses to the memory cell.

Example 58 may include the apparatus of Example 57, further comprising means for tracking a temporal history of accesses to the memory cell for a duration in excess of ten seconds.

Example 59 may include the apparatus of Example 58, further comprising means for determining a digital value corresponding to a sensed voltage of the memory cell, and means for determining the value of the memory cell based on the digital value and the temporal history of accesses to the memory cell.

Example 60 may include the apparatus of any of Examples 57 to 59, wherein the memory comprises a multi-level memory.

Example 61 may include the apparatus of Example 60, wherein the multi-level memory comprises a phase change memory.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. An electronic processing system, comprising:
   a processor;
   multi-level memory communicatively coupled to the processor;
   an analog-to-digital converter communicatively coupled to the multi-level memory to convert an analog voltage level of a memory cell of the multi-level memory to a corresponding multi-bit digital value; and
   logic communicatively coupled to the multi-level memory and the analog-to-digital converter to:
      determine a single-bit value of the memory cell based on the multi-bit digital value, and
      adjust the determination of the single-bit value of the memory cell for potential drift of the analog voltage level of the memory cell based on a temporal history of accesses to the memory cell.

2. The system of claim 1, wherein the logic is further to: apply error correction to determine the value of the memory cell based on the multi-bit digital value.

3. The system of claim 1, wherein the logic is further to: track a history of accesses to the memory cell.

4. The system of claim 3, wherein the logic is further to: track the temporal history of accesses to the memory cell for a duration in excess of ten seconds.

5. The system of claim 1, wherein the multi-level memory comprises a phase change memory.

6. The system of claim 5, wherein the phase change memory comprises a three dimensional crosspoint memory.

7. A semiconductor apparatus, comprising:
   one or more substrates; and
   logic coupled to the one or more substrates, wherein the logic is at least partly implemented in one or more of configurable logic and fixed-functionality hardware logic, the logic coupled to the one or more substrates to:
      convert an analog voltage level of a memory cell of a multi-level memory to a multi-bit digital value,
      determine a single-bit value of the memory cell based on the multi-bit digital value, and
      adjust the determination of the single-bit value of the memory cell for potential drift of the analog voltage level of the memory cell based on a temporal history of accesses to the memory cell.

8. The apparatus of claim 7, wherein the logic is further to:

apply error correction to determine the value of the memory cell based on the multi-bit digital value.

9. The apparatus of claim 7, wherein the logic is further to:
track a history of accesses to the memory cell.

10. The apparatus of claim 9, wherein the logic is further to:
track the temporal history of accesses to the memory cell for a duration in excess of ten seconds.

11. The apparatus of claim 7, wherein the multi-level memory comprises a phase change memory.

12. The apparatus of claim 11, wherein the phase change memory comprises a three dimensional crosspoint memory.

13. The apparatus of claim 7, wherein the logic coupled to the one or more substrates includes transistor channel regions that are positioned within the one or more substrates.

14. A method of determining a memory value, comprising:
converting an analog voltage level of a memory cell of a multi-level memory to a multi-bit digital value;
determining a single-bit value of the memory cell based on the multi-bit digital value; and
adjusting the determination of the single-bit value of the memory cell for potential drift of the analog voltage level of the memory cell based on a temporal history of accesses to the memory cell.

15. The method of claim 14, further comprising:
applying error correction to determine the value of the memory cell based on the multi-bit digital value.

16. The method of claim 14, further comprising:
tracking a history of accesses to the memory cell.

17. The method of claim 16, further comprising:
tracking the temporal history of accesses to the memory cell for a duration in excess of ten seconds.

18. The method of claim 14, wherein the multi-level memory comprises a phase change memory.

19. The method of claim 18, wherein the phase change memory comprises a three dimensional crosspoint memory.

* * * * *